United States Patent
Sanie et al.

(10) Patent No.: US 6,931,617 B2
(45) Date of Patent: Aug. 16, 2005

(54) MASK COST DRIVEN LOGIC OPTIMIZATION AND SYNTHESIS

(75) Inventors: Michael Sanie, Menlo Park, CA (US); Dipankar Pramanik, Saratoga, CA (US); Susan Jennifer Lippincott, Redwood City, CA (US)

(73) Assignee: Synopsys, Inc., Mountain View, CA (US)

( * ) Notice: Subject to any disclaimer, the term of this patent is extended or adjusted under 35 U.S.C. 154(b) by 92 days.

(21) Appl. No.: 10/420,951

(22) Filed: Apr. 21, 2003

(65) Prior Publication Data

US 2004/0210856 A1 Oct. 21, 2004

(51) Int. Cl.[7] .............................................. G06F 17/50
(52) U.S. Cl. ................ 716/18; 716/1; 716/2; 716/21
(58) Field of Search ...................... 716/1, 2, 18, 19–21; 250/310

(56) References Cited

U.S. PATENT DOCUMENTS 6,388,253 B1 * 5/2002 Su ............................ 250/310
2004/0117744 A1 * 6/2004 Nation et al. .................. 716/1
2004/0128641 A1 * 7/2004 Broberg et al. ............... 716/18

* cited by examiner

Primary Examiner—Thuan Do
(74) Attorney, Agent, or Firm—Bever, Hoffman & Harms LLP; Jeanette S. Harms

(57) ABSTRACT

The cost of making a mask set cost has been dramatically increasing due to demand for very small device sizes as well as higher chip complexity. Thus, users would like to minimize the total mask costs. Current logic synthesis tools can create mask designs based on IC characteristics, e.g. speed, area, and power consumption. Therefore, a method of providing a mask design that can be optimized for cost is described. This method includes accessing cells from a library, wherein each cell includes a mask cost metric. Additionally, the weightings of one or more parameters in a constraints listing can be determined. Of importance, at least one parameter relates to mask cost. At this point, logic synthesis can be performed on the design using both the cells and the constraints listing. Advantageously, the resulting synthesized design can be optimized for mask cost.

44 Claims, 3 Drawing Sheets

MASK COST DRIVEN LOGIC OPTIMIZATION AND SYNTHESIS

BACKGROUND OF THE INVENTION

1. Field of the Invention

The present invention relates generally to a mask design and, in particular to the logic optimization and synthesis of that design based on cost.

2. Related Art

As integrated circuits become increasingly complex, engineers are increasingly using electronic design automation (EDA) tools, such as logic synthesis tools, to convert architectural designs, which describe desired circuits and their interconnection on an integrated circuit, into mask layouts. FIG. 1 illustrates a conventional logic synthesis process 100. In process 100, an architectural design 101, which describes features of the integrated circuit, can be provided. This architectural design 101 can be written in a Hardware Description Language (HDL), such as VHDL or Verilog. In step 102, a compiler tool can perform a logic synthesis (also called a compile) of architectural design 101. To perform this function, the compiler receives architectural design 101 as well as information from a cell library 106 and one or more constraints 107.

Cell library 106 contains detailed information regarding the cells of the specific proprietary technology selected (e.g. from LSI, VLSI, Texas Instruments, Xilinx Inc., etc.). Such information could include, for example, a description of the logic, area, timing, power consumption, and pin descriptions, for each cell in cell library 106. Note that cells in cell library 106 can include various levels of complexity. For example, cells can provide models of specific transistors, logic gates (AND, OR, XOR etc.), or even functional units (e.g. adders, multiplexers, etc.).

Constraints 107 can be used to weigh certain parameters to ensure desired characteristics of the resulting integrated circuit. These desired characteristics could relate to, for example, area, timing, testability, power consumption, and other physical limitations associated with the integrated circuit. In logic synthesis (step 102), the compiler can map architectural design 101 onto cell library 106 while trying to achieve constraints 107. At this point, a preliminary netlist can be generated.

In step 103, the compiler can then perform physical processing on the preliminary netlist. This physical processing includes determining the optimal placement of components in the design. In one embodiment, this physical processing can include partitioning, floor planning, placement, routing, and compaction. The objective of physical processing is to generate the most efficient mapping of the components in the integrated circuit.

In step 104, the resulting mapped netlist can be checked to verify its performance. This verification can be performed using layout versus schematic (LVS), design rule checking (DRC), or layout extraction tools. In step 105, an output file including the mapped netlist can be generated. At this point, the mapped netlist can be used to fabricate a mask set for exposing a wafer that will provide the desired integrated circuit.

A typical mask set for a technology node above $0.13\mu$ has typically averaged about $30,000. Because such mask set cost was roughly only 2% of the total chip fabrication cost, this metric was not as important a factor as the standard metrics of timing, area, and power. Unfortunately, mask set cost has dramatically increased due to demand for even smaller device sizes as well as chip complexity. For example, a current mask set for technology below $0.13\mu$ could now cost $800,000 to $1,000,000, which comprises about 10% of the total chip cost.

Therefore, a need arises for a technique of incorporating consideration of mask cost into a logic synthesis process.

SUMMARY OF THE INVENTION

The cost of making a mask set cost has been dramatically increasing due to demand for very small device sizes as well as higher chip complexity. Thus, for certain integrated circuits (ICs), particularly where the volume may be low, users would like to minimize the total mask costs. However, current logic synthesis tools create mask designs based on IC characteristics, e.g. speed, area, and power consumption. Unfortunately, performing logic synthesis to minimize area, for example, would probably lead to smaller silicon cost, but might actually increase mask costs. Therefore, in accordance with one feature of the invention, a method of providing a mask design that can be optimized for cost is described.

This method includes accessing cells from a library, wherein each cell includes a mask cost metric. Additionally, the weightings of one or more parameters in a constraints listing can be determined. Of importance, at least one parameter relates to mask cost. At this point, logic synthesis can be performed on the design. Specifically, in accordance with one feature of the invention, performing logic synthesis can use both the cells and the constraints listing. Advantageously, the resulting synthesized design can be optimized for mask cost.

In one embodiment, the mask cost metric can account for a characteristic of a mask writing tool, such as exposure type. For example, the mask cost metric associated with a vector scan mask writing tool could be different than a mask cost metric associated with a raster scan mask writing tool. In another embodiment, the mask cost metric can account for an amount of optical proximity correction (OPC) features provided in a cell. For example, the more OPC applied to a cell could result in a higher mask cost metric. In yet another embodiment, the mask cost metric can account for an amount of phase-shifted features provided in a cell. For example, the more phase shifting applied to a cell could result in a higher mask cost metric.

In one embodiment, performing the logic synthesis includes computing a total cost for a cell. The total cost can be computed by multiplying each metric of a cell by an associated weighting to generate a product value and summing the product values. For example, if area, timing, power, and mask cost are included as metrics, then the total cost for a cell could be (W1×area)+(W2×timing)+(W3×power)+(W4×mask cost), wherein W1–W4 can be weightings for their associated metrics. This total cost can be compared with a maximum cost, which could be provided by a user.

In another embodiment of the invention in which the logic synthesis tool is unable to consider the mask cost (perhaps due to exceeding a maximum number of constraints and/or parameters), the mask cost metric could replace another metric. In other words, if the logic synthesis tool can accept area as a metric, then the mask cost metric can replace the area metric for each library cell. Additionally, the weighting for the area parameter could in fact be the weighting for the mask cost parameter. Thus, in this embodiment, the logic synthesis tool can be keyed to optimize for mask cost by using the area parameter. Note that other embodiments of the invention could replace mask cost for any other metric already accepted in the cell library.

In one embodiment, determining the weightings for the parameters can include determining a volume of integrated circuits that will be produced by a mask set made using the optimized design.

DETAILED DESCRIPTION OF THE FIGURES

Figure 1:
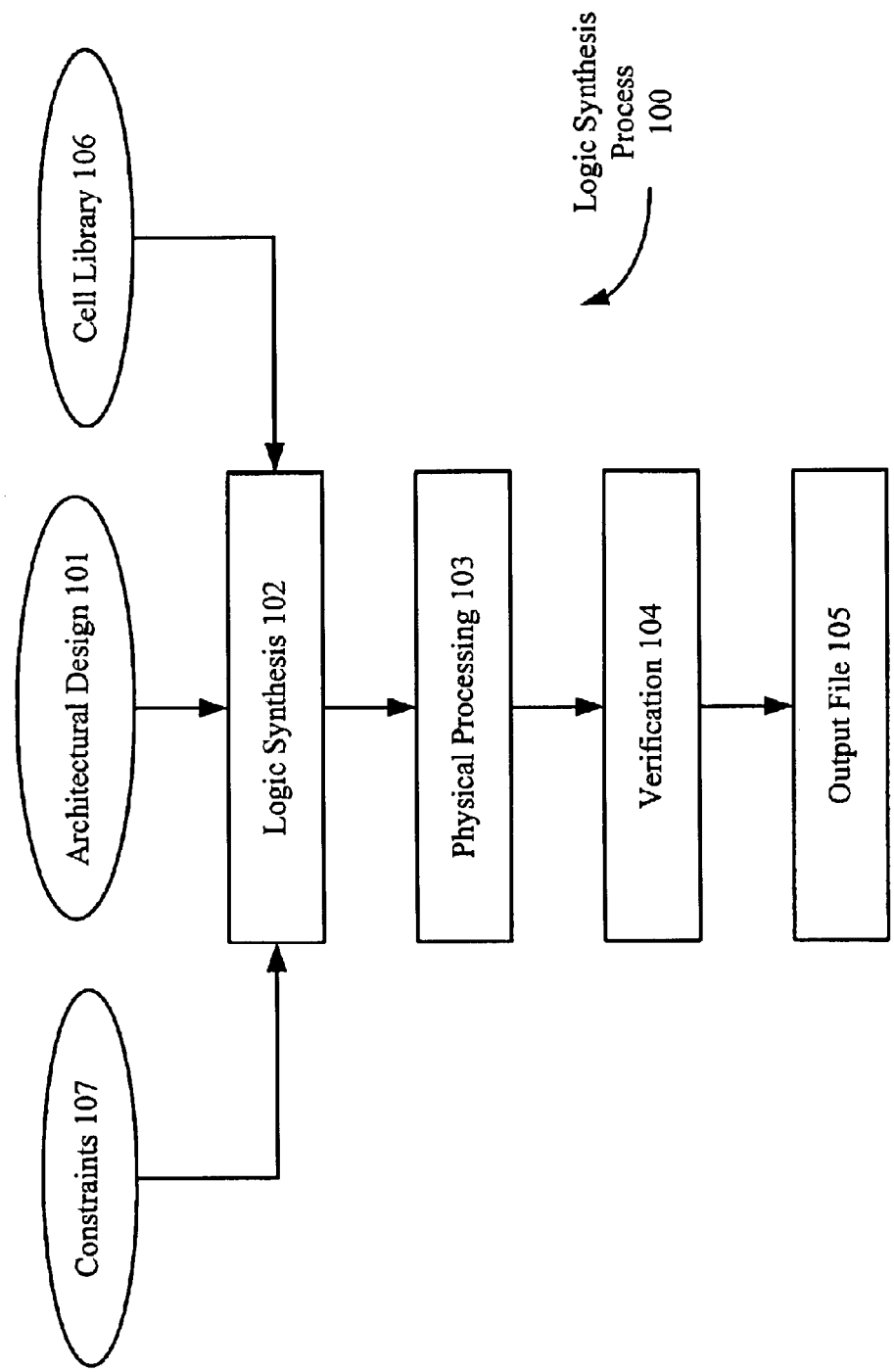
FIG. 1 illustrates a conventional logic synthesis process.

Converting an architectural design of an integrated circuit, which describes user-desired circuits and their interconnection, into a mask layout suitable for commercial production is typically done by optimizing one or more parameters. For example, a mask used to fabricate one integrated circuit might be optimized for area wherein the resulting integrated circuit is as small as possible. Another mask to fabricate another integrated circuit might be optimized for timing wherein the resulting integrated circuit runs as fast as possible. Yet another mask to fabricate another integrated circuit could be optimized for power wherein the resulting integrated circuit uses as little power as possible. Although it might be desirable to have all these advantages, i.e. small area, fast timing, and low power, realistically, not all can be realized on the same integrated circuit. Therefore, a user must decide which of these parameters is more important for a particular integrated circuit. This process is called "weighing" the parameters.

Due to demand for extremely small device sizes (e.g. below $0.13\mu$) as well as increased chip complexity, mask set cost has dramatically increased. Unfortunately, during a conventional design to mask conversion process, a parameter directly related to mask cost is not requested. Although a user could "relax" (i.e. decrease the weighting associated with) other conversion parameters, this method would effectively entail a user guessing the appropriate weightings for the parameters to provide a cost-effective mask design. Thus, to ensure a cost-effective mask design, users would probably be conservative in estimating the appropriate weightings, thereby yielding larger/slower/more power consuming integrated circuits than might actually be necessary to obtain a particular cost associated with a mask.

In accordance with one feature of the invention,:users can be provided the capability to control this increasingly important parameter during mask design while balancing other conventional parameters, such as timing, area, and power. In one embodiment, a mask cost metric can be included in a set of metrics for each cell in a cell library. Additionally, a user can provide weightings for all allowed constraint parameters, including mask cost. These constraint parameters can be provided in combination with the enhanced cell library to a logic synthesis tool for design to mask conversion. As described in further detail below, the mask cost metric and the mask cost parameter constraint advantageously allow a user to efficiently and accurately balance mask cost, area, timing, and power optimization in a logic synthesis process.

Enhanced Cell Library Includes Mask Cost Metric

In accordance with one feature of the invention, a mask cost metric can be incorporated into each cell of a cell library. This metric can represent the mask cost associated with using each library cell. For example, in one embodiment, the cell may require multiple semiconductor layers to implement its structures. In this case, because each layer may have a different mask cost, the mask cost metric can include identifying a cost associated with each layer and/or summing the costs of all layers needed to implement that cell's structures.

The mask cost metric can be obtained in various ways. In one embodiment, the mask cost metric could relate to the type of mask writing process used to make the mask. Two main techniques are used in the exposing step of an electron beam mask writing process: raster scan and vector scan.

In a raster scan system, the output of the scanner is moved in horizontal passes across the entire reticle and shifted an increment downwards after each pass, with the electron beam being applied to regions where the resist is to be exposed. The "spot size" of the electron beam can be set small to enable precise scanning of the reticle layout or set larger to speed up the scanning process.

In a vector scan system, the electron beam is moved directly to regions that are to be exposed. Most modern vector scan systems employ a shaped spot technique, in which the electron beam is formed into various polygon shapes. The regions to be exposed are decomposed into polygons (e.g. rectangles and triangles). Then, each polygon can be exposed in a single shot by the electron beam, which is shaped to match the polygon being exposed. Thus, in one embodiment, the mask cost metric could be a "weighted edge count" of the exposure polygons used to form structures in that cell.

Vector scanning can be more efficient than raster scanning because the mask writing tool does not have to scan the entire surface of the reticle. Therefore, a sparse layout will be written much faster on a vector scan system than a raster scan system. However, individually targeting the many features in a dense, complex layout can make a vector scan system take longer to write the layout than a raster scan system.

Figure 2A:
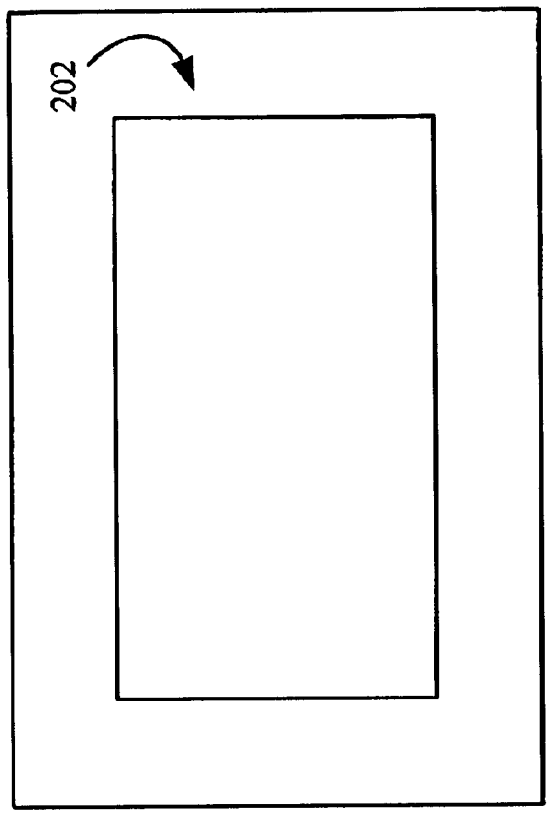
FIGS. 2A and 2B show how exposure polygons can be determined for different structures that could provide identical functionality.
Figure 2B:
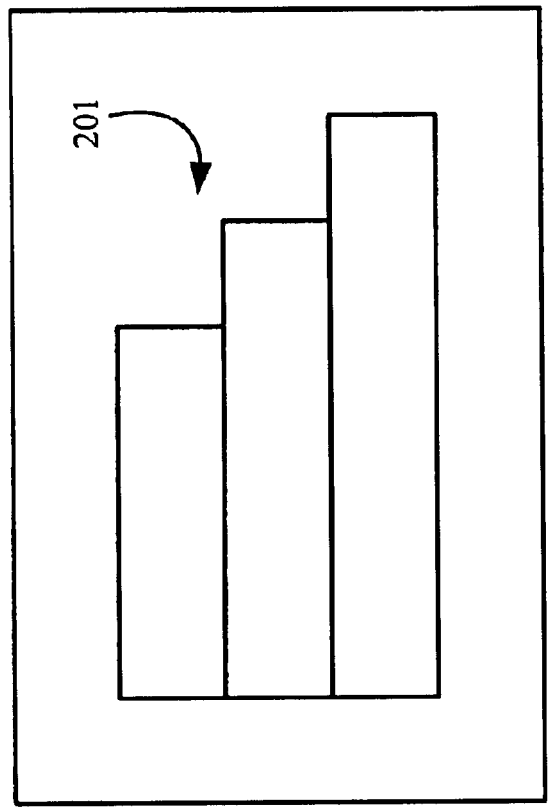

FIGS. 2A and 2B show how exposure polygons can be determined for different structures that could provide identical functionality. Specifically, FIGS. 2A and 2B illustrate structures 201 and 202, respectively, that form part of different library cells that, in this case, provide identical functionality. In a vector mask writing process, structures 201 and 202 can be analyzed to determine which polygons are needed to make the mask. In the case of structure 201, three different polygons (i.e. three different size rectangles) are needed. However, in the case of structure 202, only one polygon (i.e. one size rectangle) is needed. Therefore, a mask writing tool might take up to three times longer to form structure 201 compared to structure 202. Therefore, in one embodiment where a vector mask writing tool will be used, the mask cost metric for structure 201 could be 3N whereas the mask cost metric for structure 201 could be N. One exemplary tool for fracturing layout structures into exposure polygons is the CATS™ mask data preparation (MDP) software, licensed by Numerical Technologies, Inc.

In contrast, for a raster scan mask writing process, structure 201 might take less time to write than structure 202 because structure 201 has less area to be written than structure 202. For example, structure 201 could take $0.8\,\mu\text{sec}$ to write whereas structure 202 could take $1\,\mu\text{sec}$ to write. Therefore, in one generic embodiment where a raster scan writing tool will be used, the mask cost metric for structure 201 could be 0.8N whereas the mask cost metric for structure 202 could be N.

The mask cost metric could also take into account the amount of optical proximity correction (OPC) features provided in the cell. OPC applies systematic changes to geometries of a layout to improve the printability of a wafer pattern. Specifically, as the size of integrated circuit features drops to $0.18\mu$ and below, the features can become smaller than the wavelength of the light used to create such features, thereby creating lithographic distortions when printing the features onto the wafer. These lithographic distortions can represent significant impacts on device performance.

Rule-based OPC can include rules to implement certain changes to the layout, thereby compensating for some lithographic distortions. For example, to compensate for line-end shortening, rule-based OPC can add a hammerhead to a line end. Additionally, to compensate for corner rounding, rule-based OPC can add (or subtract) serif shapes from outer (or inner) corners. These changes can form features on the wafer that are closer to the original intended layout.

In model-based OPC, a real pattern transfer can be simulated (i.e. predicted) with a set of mathematical formulas (i.e. models). In model-based OPC, the edges of a feature in a layout can be dissected into a plurality of segments, thereby allowing these segments to be individually moved to correct for proximity effects. The placement of the dissection points is determined by the feature shape, size, and/or position relative to other features. In some embodiments, a fixed dissection length can be used for edges, e.g. every N nm. In other embodiments, multiple dissection lengths are provided, e.g. inner corner, outer corner, etc. In yet other embodiments, dissection points can be determined by exploring the optical and resist proximity behavior along the edges based on simulation or wafer results.

In accordance with one embodiment, the mask cost metric could include the costs of writing such OPC features, whether rule-based or model-based, onto the mask. For example, if a polysilicon layer uses aggressive OPC to define its structures, then that polysilicon layer could have a higher mask cost metric than an insulating layer using less aggressive OPC. In one embodiment, the projected write time associated with OPC features on each layer can be determined and then summed to provide the mask cost metric for a library cell.

In another embodiment, the mask cost metric can account for an amount of phase-shifted features provided in a cell. Phase shifting is able to generate features on the wafer that are smaller than the corresponding wavelength of the light. These ultra-small features are generated by the destructive interference of light in adjacent, complementary pairs of phase shifters having opposite phase, e.g. 0 and 180 degrees. Therefore, rather than constructively interfering and merging into a single image, the projected images destructively interfere where their edges overlap, thereby creating a clear and very small image between the phase shifters. In accordance with this embodiment, the more phase shifting applied to a cell could result in a higher mask cost metric.

Constraints Include Mask Cost Parameter

Figure 3:
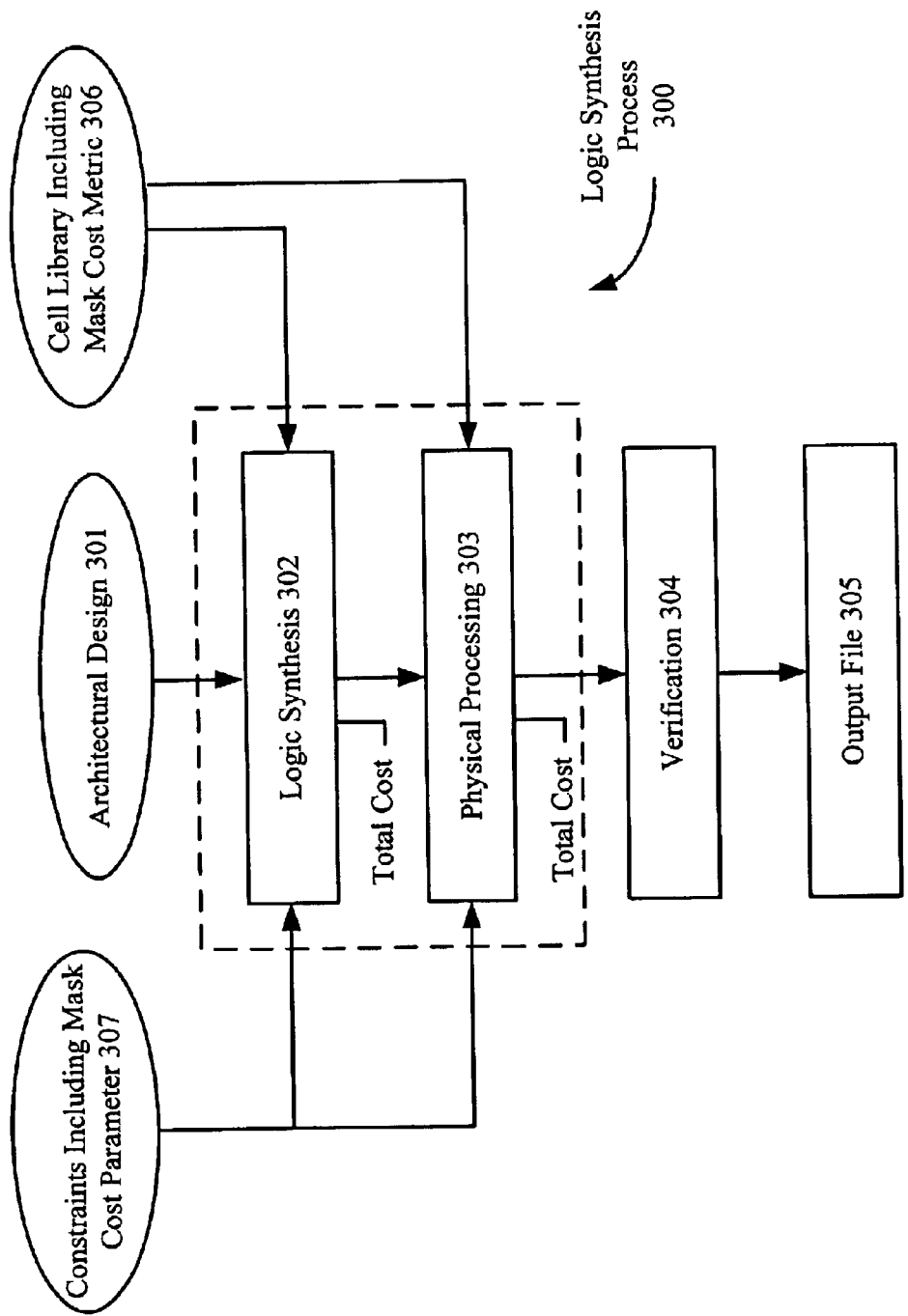
FIG. 3 illustrates a logic synthesis process in which various metrics and constraints, including mask cost, can be efficiently and accurately considered.

In accordance with one feature of the invention, a logic synthesis tool can consider the mask cost metric of a library cell as well as a constraint including a mask cost parameter, thereby allowing a user to advantageously minimize the overall mask cost in a design to mask conversion process. Specifically, FIG. 3 illustrates a logic synthesis process 300 in which various metrics and constraints can be considered. In one embodiment, process 300 can be implemented in a CAD environment within a computer system.

In process 300, an architectural design 301, written in a Hardware Description Language (HDL) or another computer readable language, can be received. In step 302, a compiler tool can perform a logic synthesis (also called a compile) of architectural design 301. To perform this function, the compiler receives architectural design 301 as well as information from a cell library 306 and one or more constraints 307.

Cell library 306 contains detailed information regarding the cells of the specific proprietary technology selected. Such information could include, for example, a description of the logic, area, timing, power consumption, and pin descriptions for each cell in cell library 306. Cells in cell library 306 can include one or more levels of complexity. For example, cells could provide models of specific transistors, logic gates, or even functional units. In one embodiment, cell library 306 can be implemented as a database stored in memory.

In accordance with one feature of the invention, cell library 306 can further include the mask cost metric for each cell. Of importance, this mask cost metric affects the model, but not the layout, of the cell. In other words, the mask cost metric, like other metrics (e.g. timing, area, and power), can be used to characterize the cells in cell library 306.

Constraints 307 can be used to weigh certain parameters to ensure desired characteristics of a resulting integrated circuit as well as, in accordance with one feature of the invention, a mask set. The desired characteristics could relate to any metric allowed in cell library 306, e.g. timing, area, power, and mask cost. In one embodiment, these desired characteristics can be attained by appropriately weighting of the parameters (collectively referred to as constraints) to achieve a total cost function value that is acceptable to a user. For example, an exemplary total cost function could be computed by using the following generic equation:

$$\text{Total Cost}=(\alpha \times \text{Timing})+(\beta \times \text{Area})+(\delta \times \text{Power})+(\phi \times \text{Mask Cost})$$

wherein library 306 could provide the metrics for timing, area, power, and mask cost associated with a selected cell whereas a user could provide the $\alpha$, $\beta$, $\delta$, and $\phi$ weighting factors (i.e. multiplier values) associated with the characteristics of a resulting mask set and associated integrated circuit. In one embodiment, the user could also provide a maximum cost, wherein the total cost should be less than or equal to the maximum cost. If the total cost was more than the maximum cost, then the logic synthesis tool could be instructed to select at least one other cell from cell library 306. After logic synthesis (step 302) is completed and a user acceptable total cost is computed, a preliminary netlist can be generated using the selected cells. Advantageously, this preliminary netlist can be optimized to minimize mask cost in addition to other parameters.

In step 303, the compiler can then perform physical processing on the preliminary netlist. This physical processing includes determining the optimal placement of components (in a plane or in a three-dimensional space) in the design. In one embodiment, this physical processing can include partitioning, floor planning, placement, routing, and compaction. The objective of physical processing (step 303) is to generate the most efficient mapping of the components in the integrated circuit. To achieve this objective, physical processing can also be performed using cell library 306 and constraints 307, both of which now consider mask cost. In one embodiment, a tool licensed by Synopsys, Inc., e.g. software forming part of its Galaxy Design Platform™, can be used to perform logic synthesis (step 302) and optimization processing (step 303). Note that one or multiple tools can implement the logic synthesis and physical processing tools.

In one embodiment, the physical processing tool can also compute a total cost for the integrated circuit and select an optimum solution based on cost verses manufacturing efficiencies. For example, the physical processing tool may calculate that using specific cells could reduce the cost of a first logic block. However, the integrated circuit may contain other larger blocks, such as memory, that require extensive RET, which dominate the cost of the chip. In this case, there may be little benefit to optimize the cost of the first logic block. Specifically, there may be more efficiency during the mask data preparation stage to use the same type of cell in every logic block.

In step 304, the resulting mapped netlist can be checked to verify its performance. This verification can be performed using layout versus schematic (LVS), design rule checking (DRC), or layout extraction tools. In step 305, an output file including the mapped netlist can be generated. In one embodiment, this output file can include a GDS-II data file. At this point, the mapped netlist can be used to fabricate a mask set for exposing a wafer that will provide the desired integrated circuit.

In another embodiment of the invention in which the logic synthesis tool is unable to consider the mask cost (perhaps due to exceeding a maximum number of constraints and/or parameters), the mask cost metric could replace the area metric for each library cell. Moreover, the weighting for the area parameter (provided as a typical constraint) could in fact be the weighting for the mask cost parameter. Thus, in this embodiment, the logic synthesis tool can be keyed to optimize for mask cost by using the area parameter. Note that other embodiments of the invention could replace mask cost for another metric already provided in the cell library.

In one embodiment, determining the weighting for the mask cost parameter could include determining the volume of integrated circuits that will be produced by the mask set. Specifically, mask set costs are spread over the number of integrated circuits made using that mask set. Therefore, a high volume application could have a lower mask cost parameter weighting than a low volume application.

Other Embodiments

Although illustrative embodiments of the invention have been described in detail herein with reference to the figures, it is to be understood that the invention is not limited to those precise embodiments. They are not intended to be exhaustive or to limit the invention to the precise forms disclosed. As such, many modifications and variations will be apparent. For example, in one embodiment, the mask cost could include inspection and repair costs in addition to writing costs. For example, the more exposure polygons used during mask writing, the more phase shifted features, and/or the more OPC features provided in the cell (i.e. the level of complexity associated with the cell), the greater the probability that increased inspection time and additional repairs could be needed. Therefore, the associated inspection and repair costs could also be factored into the mask cost metric for each cell. Note that the mask writing techniques described herein can be applied to any lithographic process technology, including ultraviolet, deep ultraviolet (DUV), extreme ultraviolet (EUV), x-ray, and ebeam. Accordingly, it is intended that the scope of the invention be defined by the following claims and their equivalents.

What is claimed is:

1. A method of providing a design that can be optimized for mask cost, the method compromising:

receiving an architectural design;
accessing cells from a library, wherein each cell includes a mask cost metric;
determining weightings of one or more parameters in a constraints listing, wherein at least one parameter relates to mask cost;
performing logic synthesis on the architectural design to generate a synthesized design, the logic synthesis using the cells and the constraints listing;
performing physical processing of the synthesized design to generate an efficient mapping of components; and
outputting an optimized design.

2. The method of claim 1, wherein the mask cost metric accounts for at least one characteristic of a mask writing tool.

3. The method of claim 2, wherein a characteristic includes an exposure type.

4. The method of claim 3, wherein an exposure type includes one of a vector scan and a raster scan.

5. The method of claim 1, wherein the mask cost metric accounts for an amount of phase shifted or optical proximity correction (OPC) features provided in a cell.

6. The method of claim 1, wherein another parameter relates to at least one of timing, area, and power.

7. The method of claim 1, wherein performing logic synthesis includes computing a total cost for a cell.

8. The method of claim 1, wherein determining the weightings includes determining a volume of integrated circuits that will be produced by a mask set made using the optimized design.

9. A method of providing a design that can be optimized for mask cost, the method compromising:

receiving an architectural design;
accessing cells from a library, wherein each cell includes a mask cost metric;
determining weightings of one or more parameters in a constraints listing, wherein at least one parameter relates to mask cost;
performing logic synthesis on the architectural design to generate a synthesized design, the logic synthesis using the cells and the constraints listing;
performing physical processing of the synthesized design to generate an efficient mapping of components; and
outputting an optimized mask design,
wherein performing logic synthesis includes computing a total cost for a cell, and
wherein computing the total cost includes multiplying each metric of a cell by an associated weighting to generate a product value and summing the product values.

10. The method of claim 9, further including comparing the total cost with a maximum cost.

11. The method of claim 10, wherein the maximum cost is provided by a user.

12. A method of providing a design that can be optimized for mask cost, the method compromising:

receiving an architectural design;
accessing cells from a library, wherein each cell includes a mask cost metric;
determining weightings of one or more parameters in a constraints listing, wherein at least one parameter relates to mask cost;
performing logic synthesis on the architectural design to generate a synthesized design, the logic synthesis using the cells and the constraints listing;

performing physical processing of the synthesized design to generate an efficient mapping of components; and outputting an optimized mask design, wherein the mask cost metric replaces another metric and a designation for the mask cost metric refers to the other metric.

13. The method of claim 12, wherein a designation for the at least one parameter refers to another parameter.

14. The method of claim 13, wherein the designations for the other metric and the other parameter refer to area.

15. A method of performing operations on an architectural design, the method compromising:

accessing the architectural design;

accessing cells from a library, wherein each cell includes a mask cost metric;

accessing weightings associated with a plurality of parameters, wherein at least one parameter relates to mask cost;

performing logic synthesis on the architectural design using selected cells and the weightings to generate a synthesized design; and performing physical processing on the synthesized design to generate an efficient mapping of components.

16. The method of claim 15, wherein performing logic synthesis includes computing a total cost for a selected cell.

17. The method of claim 15, wherein determining the weightings includes determining a volume of integrated circuits that will be produced by a mask set made using the synthesized design.

18. A method of performing logic synthesis on an architectural design, the method compromising:

accessing the architectural design;

accessing cells from a library, wherein each cell includes a mask cost metric;

accessing weightings associated with a plurality of parameters, wherein at least one parameter relates to mask cost; and performing logic synthesis on the architectural design using selected cells and the weightings, wherein performing logic synthesis includes computing a total cost for a selected cell, and wherein computing the total cost includes multiplying each metric of a selected cell by an associated weighting to generate a product value and summing the product values.

19. The method of claim 18, further including comparing the total cost with a maximum cost.

20. The method of claim 19, wherein the maximum cost is provided by a user.

21. A method of performing logic synthesis on an architectural design, the method compromising:

accessing the architectural design;

accessing cells from a library, wherein each cell includes a mask cost metric;

accessing weightings associated with a plurality of parameters, wherein at least one parameter relates to mask cost; and performing logic synthesis on the architectural design using selected cells and the weightings, wherein the mask cost metric replaces another metric and a designation for the mask cost metric refers to the other metric.

22. The method of claim 21, wherein a designation for the at least one parameter refers to another parameter.

23. The method of claim 22, wherein the designations for the other metric and the other parameter refer to area.

24. A computer program for defining a mask layout, wherein the mask layout can optimize the cost of a mask made using the mask layout, the computer program comprising:

a set of instructions for receiving an architectural design for the mask;

a set of instructions for accessing cells from a library, wherein each cell includes a mask cost metric;

a set of instructions for determining weightings of one or more parameters in a constraints listing, wherein at least one parameter relates to mask cost;

a set of instructions for performing logic synthesis on the architectural design to generate a synthesized design, the logic synthesis using the cells and the constraints listing; and a set of instructions for performing physical processing of the synthesized design to generate an efficient mapping of components.

25. The computer program of claim 24, wherein the mask cost metric accounts for at least one characteristic of a mask writing tool.

26. The computer program of claim 25, wherein a characteristic includes an exposure type.

27. The computer program of claim 26, wherein an exposure type includes one of a vector scan and a raster scan.

28. The computer program of claim 24, wherein the mask cost metric accounts for an amount of phase shifted or optical proximity correction (OPC) features provided in a cell.

29. The computer program of claim 24, wherein another parameter relates to at least one of timing, area, and power.

30. The computer program of claim 24, wherein the set of instructions for performing logic synthesis includes a set of instructions for computing a total cost for a cell.

31. The computer program of claim 24, wherein the set of instructions for determining the weightings includes a set of instructions for considering a volume of integrated circuits that will be produced by a mask set made using the optimized design.

32. A computer program for defining a mask layout, wherein the mask layout can optimize the cost of a mask made using the mask layout, the computer program comprising:

a set of instructions for receiving an architectural design for the mask;

a set of instructions for accessing cells from a library, wherein each cell includes a mask cost metric;

a set of instructions for determining weightings of one or more parameters in a constraints listing, wherein at least one parameter relates to mask cost; and a set of instructions for performing logic synthesis on the architectural design to generate an optimized design, the logic synthesis using the cells and the constraints listing, wherein the set of instructions for performing logic synthesis includes a set of instructions for computing a total cost for a cell, and wherein the set of instructions for computing the total cost includes a set of instructions for multiplying each metric of a cell by an associated weighting to generate a product value and summing the product values.

33. The computer program of claim 32, further including a set of instructions for comparing the total cost with a maximum cost.

34. The computer program of claim 33, wherein the maximum cost is provided by a user.

35. A computer program for defining a mask layout, wherein the mask layout can optimize the cost of a mask made using the mask layout, the computer program comprising:

a set of instructions for receiving an architectural design for the mask;

a set of instructions for accessing cells from a library, wherein each cell includes a mask cost metric;

a set of instructions for determining weightings of one or more parameters in a constraints listing, wherein at least one parameter relates to mask cost; and a set of instructions for performing logic synthesis on the architectural design to generate an optimized design, the logic synthesis using the cells and the constraints listing, wherein the mask cost metric replaces another metric and a designation for the mask cost metric refers to the other metric.

36. The computer program of claim 35, wherein a designation for the at least one parameter refers to another parameter.

37. The computer program of claim 36, wherein the designations for the other metric and the other parameter refer to area.

38. A computer-implemented system for defining a mask layout, wherein the mask layout can optimize the cost of a mask made using the mask layout, the system comprising:

means for receiving an architectural design for the mask;

means for accessing cells from a library, wherein each cell includes a mask cost metric;

means for determining weightings of one or more parameters in a constraints listing, wherein at least one parameter relates to mask cost; and means for performing logic synthesis on the architectural design to generate a synthesized design, the logic synthesis using the cells and the constraints listing; and means for performing physical processing of the synthesized design to generate an efficient mapping of components.

39. The system of claim 38, wherein the means for performing logic synthesis includes means for computing a total cost for a cell.

40. The system of claim 39, wherein the means for computing the total cost includes means for multiplying each metric of a cell by an associated weighting to generate a product value and summing the product values.

41. The system of claim 40, further including means for comparing the total cost with a maximum cost.

42. The system of claim 38, wherein the mask cost metric replaces another metric and a designation for the mask cost metric refers to the other metric.

43. The system of claim 42, wherein a designation for the at least one parameter refers to another parameter.

44. The system of claim 43, wherein the designations for the other metric and the other parameter refer to area.

* * * * *